(12) United States Patent
Huang et al.

(10) Patent No.: US 9,966,425 B1
(45) Date of Patent: May 8, 2018

(54) METHOD FOR FABRICATING A MIM CAPACITOR

(71) Applicant: UNITED MICROELECTRONICS CORP., Hsin-Chu (TW)

(72) Inventors: Jen-Po Huang, Tainan (TW); Chin-Fu Lin, Tainan (TW); Bin-Siang Tsai, Changhua County (TW); Xu Yang Shen, Singapore (SG); Seng Wah Liau, Singapore (SG); Yen-Chen Chen, Tainan (TW); Ko-Wei Lin, Taichung (TW); Chun-Ling Lin, Tainan (TW); Kuo-Chih Lai, Tainan (TW); Ai-Sen Liu, Hsinchu (TW); Chun-Yuan Wu, Yun-Lin County (TW); Yang-Ju Lu, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/445,953

(22) Filed: Feb. 28, 2017

(51) Int. Cl.
*H01L 21/8242* (2006.01)
*H01L 49/02* (2006.01)

(52) U.S. Cl.
CPC ............. *H01L 28/56* (2013.01); *H01L 28/60* (2013.01)

(58) Field of Classification Search
CPC ......... H01L 28/75; H01L 28/60; H01L 28/40; H01L 21/28185; H01L 28/56
See application file for complete search history.

(56) References Cited

U.S. PATENT DOCUMENTS

| | | | |
|---|---|---|---|
| 5,712,177 A * | 1/1998 | Kaushik | H01L 21/28185 257/E21.209 |
| 8,907,449 B2 | 12/2014 | Takahashi et al. | |
| 8,954,125 B2 | 2/2015 | Corcoles Gonzalez et al. | |
| 9,257,498 B1 | 2/2016 | Hsu et al. | |
| 9,368,392 B2 | 6/2016 | Tseng et al. | |
| 9,409,234 B2 | 8/2016 | Haubold et al. | |
| 9,502,493 B2 | 11/2016 | Cheng et al. | |
| 9,502,494 B2 | 11/2016 | Liang et al. | |
| 9,545,363 B2 | 1/2017 | Kim et al. | |
| 2003/0096473 A1* | 5/2003 | Shih | H01L 21/31604 438/240 |
| 2006/0024975 A1* | 2/2006 | Ahn | C23C 16/405 438/778 |
| 2008/0002330 A1* | 1/2008 | Park | C23C 16/405 361/311 |
| 2010/0164064 A1* | 7/2010 | Kim | H01L 21/02181 257/532 |
| 2012/0043617 A1* | 2/2012 | Nakagawa | H01L 21/28088 257/369 |
| 2016/0204205 A1* | 7/2016 | Meldrim | H01L 27/11556 257/314 |
| 2017/0186757 A1* | 6/2017 | Tao | H01L 27/11507 |

* cited by examiner

*Primary Examiner* — Joseph C Nicely
*Assistant Examiner* — David Goodwin
(74) *Attorney, Agent, or Firm* — Winston Hsu

(57) ABSTRACT

A method for fabricating a metal-insulator-metal (MIM) capacitor includes the steps of: forming a capacitor bottom metal (CBM) layer on a material layer; forming a silicon layer on the CBM layer; forming a capacitor dielectric layer on the silicon layer; and forming a capacitor top metal (CTM) layer on the capacitor dielectric layer.

14 Claims, 2 Drawing Sheets

METHOD FOR FABRICATING A MIM CAPACITOR

BACKGROUND OF THE INVENTION

1. Field of the Invention

The invention relates to a method for fabricating a metal-insulator-metal (MIM) capacitor.

2. Description of the Prior Art

In semiconductor manufacturing processes, metal capacitors formed of metal-insulator-metal (MIM) are widely used in the design of ultra large scale integrations (ULSI). Because a MIM capacitor has low resistance and low parasitic capacitance, and has no problems in shifts of depletion induced voltage, MIM capacitors have become the main structure used for metal capacitors. It is therefore important to develop a MIM capacitor that comprises copper electrodes with low resistance.

With the increasing complexity of integrated circuits, the multilevel interconnect process has become the typical method used in semiconductor integrated circuit fabrication. To satisfy the requirements for high integration and high speed in integrated circuits (ICs), especially in a deep sub-micro (<0.18 µm) semiconductor process, a copper (Cu) dual damascene process is becoming more widely used as a standard process in forming an interconnection line within the inter-metal dielectric layer of low dielectric constant (low k) materials. Since copper has both a low resistance and a low electro-migration resistance, the low k materials are useful in improving the RC delay effect of a metal interconnection. Consequently, how to integrate copper fabrication processes to fabricate MIM capacitors and internal metal wires with low resistance has become a key research topic in this field.

SUMMARY OF THE INVENTION

According to a preferred embodiment of the present invention, a method for fabricating a metal-insulator-metal (MIM) capacitor includes the steps of: forming a capacitor bottom metal (CBM) layer on a material layer; forming a silicon layer on the CBM layer; forming a capacitor dielectric layer on the silicon layer; and forming a capacitor top metal (CTM) layer on the capacitor dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
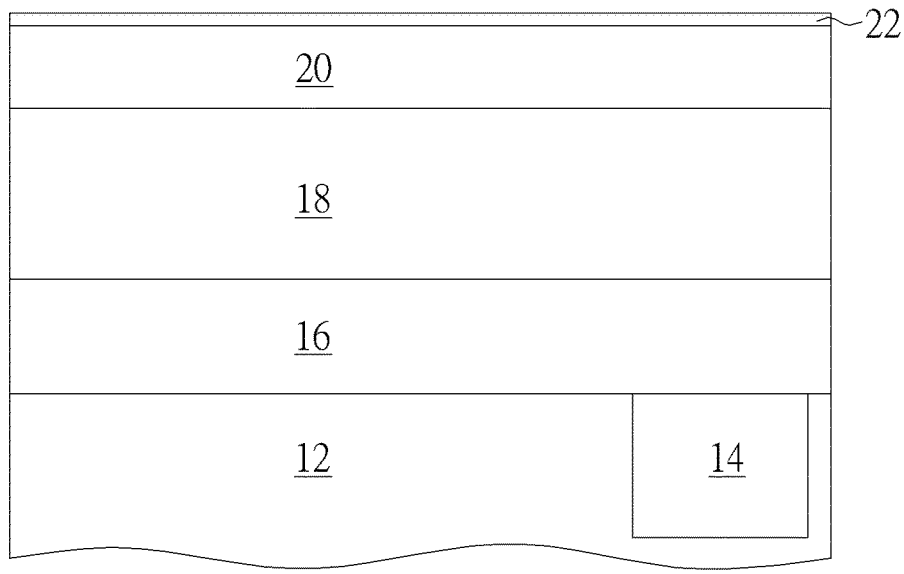
FIGS. 1-3 illustrate a method for fabricating a MIM capacitor according to a preferred embodiment of the present invention.
Figure 2:
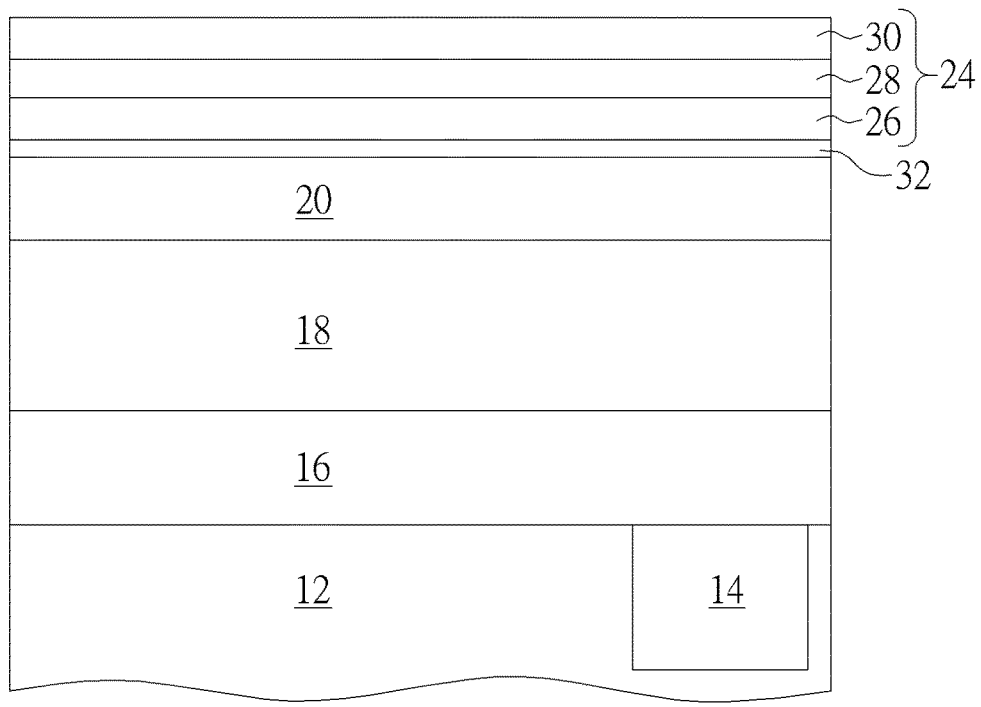
Figure 3:
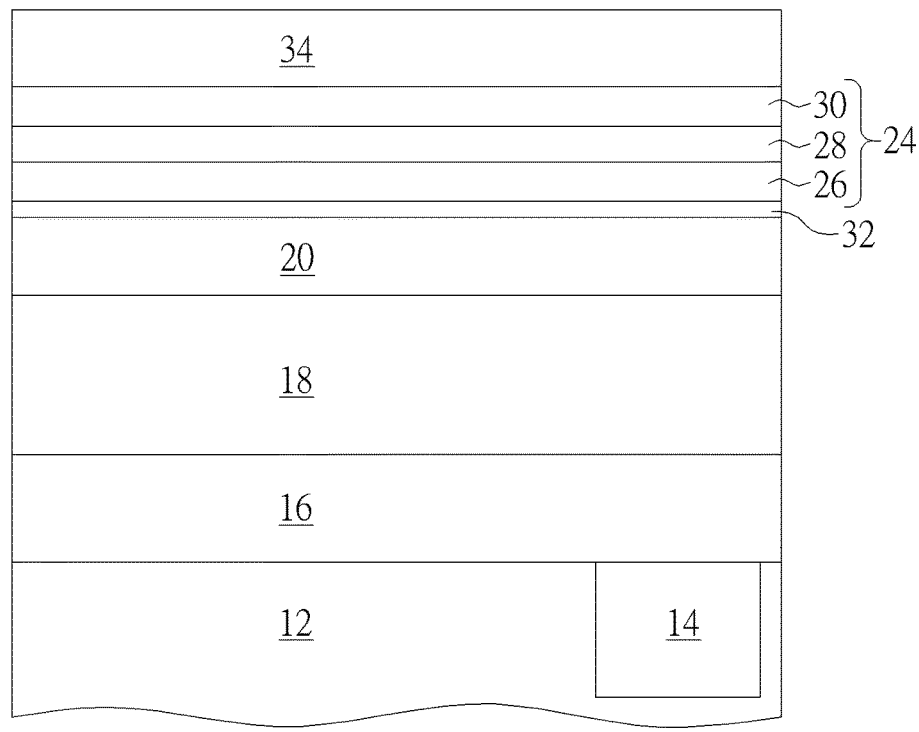

Referring to FIGS. 1-3, FIGS. 1-3 illustrate a method for fabricating a MIM capacitor according to a preferred embodiment of the present invention. As shown in FIG. 1, a material layer 12, such as a semiconductor substrate composed of silicon or a dielectric layer disposed on the semiconductor substrate is provided, and devices such as metal-oxide semiconductor (MOS) transistors, oxide-semiconductor field-effect-transistors (OS FETs), CMOS transistors, FinFETs, or other active devices could be disposed on the semiconductor substrate. The dielectric layer could be a ILD layer or a IMD layer covering active devices, in which metal interconnections 14 could be formed within the dielectric layer to electrically connect to the active devices on the semiconductor substrate.

Next, additional dielectric layers 16, 18 could be formed on the material layer 12, in which the dielectric layer 16 in this embodiment preferably includes a nitrogen doped carbide (NDC) layer and the dielectric layer 18 includes silicon dioxide, but not limited thereto.

Next, a capacitor bottom metal (CBM) layer 20 and a silicon layer 22 are sequentially formed on the dielectric layer 18. In this embodiment, the CBM layer 20 is preferably made of conductive material including but not limited to for example W, Ti, TiN, Ta, TaN, Al, or most preferably TiN or Al. The silicon layer 22 is made of amorphous silicon, but not limited thereto.

It should be noted that if the CBM layer 20 were made of TiN, the TiN preferably includes a (200) orientation, a (110) orientation, and a (111) orientation, in which a phase of the TiN in this embodiment preferably includes greater (200) orientation than both (110) orientation and (111) orientation and also preferably more (110) orientation than (111) orientation.

Next, as shown in FIG. 2, a capacitor dielectric layer 24 is formed on the silicon layer 22. In this embodiment, the capacitor dielectric layer 24 is made of multiple dielectric layers including but not limited to for example a first high-k dielectric layer 26, an insulating layer 28 on the first high-k dielectric layer 26, and a second high-k dielectric layer 30 on the insulating layer 28.

Preferably, the first high-k dielectric layer 26 and the second high-k dielectric layer 30 are made of same material such as $ZrO_x$ and the insulating layer 28 is preferably made of $AlO_x$. According to an embodiment of the present invention, the capacitor dielectric layer 24 including the high-k dielectric layer 26, insulating layer 28, and second high-k dielectric layer 30 could be formed by a physical vapor deposition (PVD) process with lowered temperature instead of an atomic layer deposition (ALD) process, in which the crystalline phase of the deposited first high-k dielectric layer 26 and/or second high-k dielectric layer 30 in particular could include tetragonal structure.

It should be noted that since the silicon layer 22 preferably made of amorphous silicon is deposited on the CBM layer 20 before the capacitor dielectric layer 24 is formed, the formation of the first high-k dielectric layer 26 which typically involves introduction of an oxygen source such as ozone ($O_3$) or water ($H_2O$) into the reaction chamber would readily facilitate combination of injected oxygen source with the pre-deposited silicon layer 22.

In other words, the silicon layer 22 would be converted in the same chamber or in-situly into a silicon dioxide layer 32 as the first high-k dielectric layer 26 is deposited on the silicon layer 22. Hence after the first high-k dielectric layer 26 formed, a silicon dioxide layer 32 is formed to replace the original amorphous silicon layer 22 between the CBM layer 20 and the first high-k dielectric layer 26 for improving leakage level of the device. It should be noted that the thickness of the silicon dioxide layer 32 could be the same as or preferably slightly greater than the thickness of the pre-deposited silicon layer 22 made of amorphous silicon, in which the thickness of the silicon layer 22 is preferably between 5-20 Angstroms whereas the thickness of the silicon dioxide layer 32 is between 5-30 Angstroms.

According to an embodiment of the present invention, in addition to $ZrO_x$, the first high-k dielectric layer 26 and the second high-k dielectric layer 30 could also be made of different dielectric material having dielectric constant (k value) larger than 4. For instance, the first high-k dielectric layer 26 and the second high-k dielectric layer 30 may also be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

After the capacitor dielectric layer 24 is formed, as shown in FIG. 3, a capacitor top metal (CTM) layer 34 is formed on the capacitor dielectric layer 24. In this embodiment, the CTM layer 34 and the CBM layer 20 are preferably made of same material such as TiN or Al. Nevertheless, the CBM layer 20 and the CTM layer 34 could also be made of different material while the CTM layer 34 could also include conductive material including but not limited to for example W, Ti, TiN, Ta, TaN, or Al.

Similar to the CBM layer 20, if the CTM layer 34 were made of TiN, the TiN preferably includes a (200) orientation, a (110) orientation, and a (111) orientation, in which a phase of the TiN in this embodiment preferably includes greater (200) orientation than both (110) orientation and (111) orientation and also preferably more (110) orientation than (111) orientation. This completes the fabrication of a MIM capacitor according to a preferred embodiment of the present invention.

Figure 4:
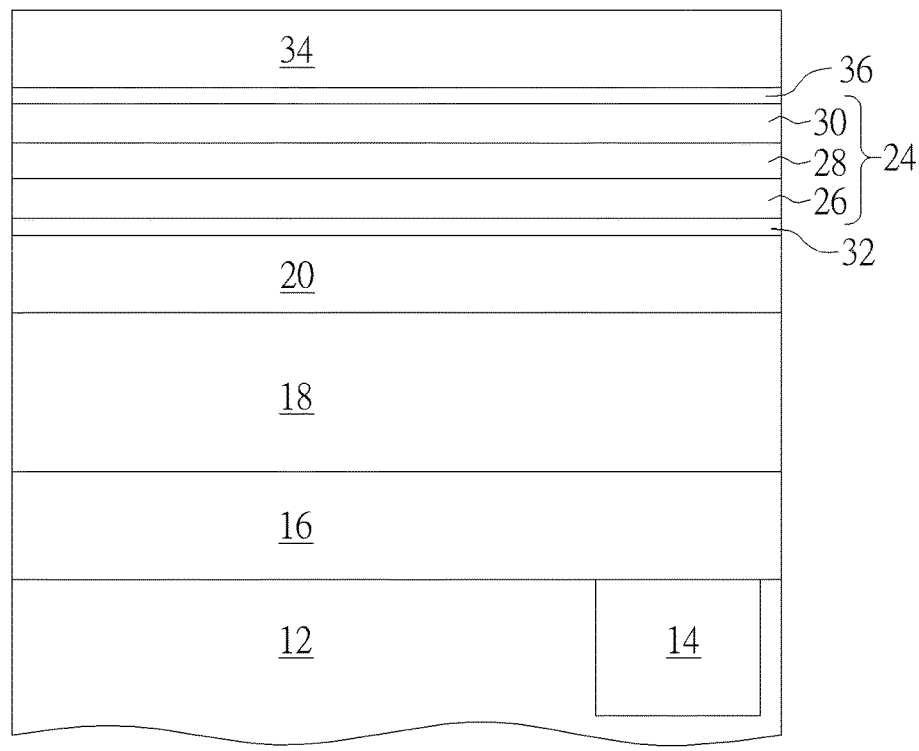
FIG. 4 illustrates a method for fabricating a MIM capacitor according to an embodiment of the present invention.

Referring to FIG. 4, FIG. 4 illustrates a method for fabricating a MIM capacitor according to an embodiment of the present invention. As shown in FIG. 4, instead of forming the CTM layer 34 directly on the capacitor dielectric layer 24, it would also be desirable to perform an extra treatment or oxidation process to form an additional silicon dioxide layer 36 on the capacitor dielectric layer 24 and then form the CTM layer 34 on top of the silicon dioxide layer 36 afterwards, which is also within the scope of the present invention.

Overall, the present invention discloses an approach of forming a silicon layer preferably made of amorphous silicon on the surface of CBM layer preferably made of TiN before a capacitor dielectric layer is formed, in which the amorphous silicon layer is preferably converted in-situly into a silicon dioxide layer when the capacitor dielectric layer containing high-k dielectric material such as $ZrO_x$ is deposited on the CBM layer. It should be noted that without the formation of this extra amorphous silicon layer on the CBM layer, a layer of titanium oxide ($TiO_x$) is typically formed on the surface of CBM layer from the oxygen source injected when a capacitor dielectric layer containing material such as $ZrO_x$ is deposited and the presence of the $TiO_x$ often lowers the bandgap and induces leakage. By forming an amorphous silicon layer prior to the deposition of capacitor dielectric layer containing high-k dielectric material such as $ZrO_x$, it is now guaranteed that no additional $TiO_x$ is formed on top of the CBM layer. Instead, a silicon dioxide layer is formed between the capacitor dielectric layer and the CBM layer to ensure that lower leakage level for the device could be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a metal-insulator-metal (MIM) capacitor, comprising:
   forming a capacitor bottom metal (CBM) layer on a material layer;
   forming an amorphous silicon layer on a surface of the CBM layer;
   forming a capacitor dielectric layer on the amorphous silicon layer and at the same time transforming the amorphous silicon layer into a silicon dioxide layer; and
   forming a capacitor top metal (CTM) layer on the capacitor dielectric layer.

2. The method of claim 1, wherein the capacitor dielectric layer comprises:
   a first high-k dielectric layer;
   an insulating layer on the first high-k dielectric layer; and
   a second high-k dielectric layer on the insulating layer.

3. The method of claim 2, wherein the first high-k dielectric layer and the second high-k dielectric layer comprise same material.

4. The method of claim 2, wherein the first high-k dielectric layer and the second high-k dielectric layer comprise $ZrO_x$.

5. The method of claim 2, wherein the insulating layer comprises $AlO_x$.

6. The method of claim 2, wherein the first high-k dielectric layer comprises a tetragonal crystalline phase.

7. The method of claim 2, wherein the second high-k dielectric layer comprises a tetragonal crystalline phase.

8. The method of claim 1, further comprising forming a silicon dioxide layer on the capacitor dielectric layer before forming the CTM layer.

9. The method of claim 1, wherein the CBM layer and the CTM layer comprise TiN.

10. The method of claim 9, wherein the TiN comprises a (200) orientation, a (110) orientation, and a (111) orientation.

11. The method of claim 10, wherein a phase of the TiN comprises greater (200) orientation than (110) orientation.

12. The method of claim 11, wherein a phase of the TiN comprises greater (110) orientation than (111) orientation.

13. The method of claim 10, wherein a phase of the TiN comprises greater (200) orientation than (110) orientation and (111) orientation.

14. The method of claim 1, wherein the CBM layer and the CTM layer comprise Al.

* * * * *